United States Patent
Hao et al.

(10) Patent No.: US 11,614,498 B2
(45) Date of Patent: Mar. 28, 2023

(54) WIRELESS NEUTRAL CURRENT SENSOR (WNCS)

(71) Applicant: Schweitzer Engineering Laboratories, Inc., Pullman, WA (US)

(72) Inventors: Kei Hao, Anaheim, CA (US); Shankar V. Achanta, Pullman, WA (US); Raymond W. Rice, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 660 days.

(21) Appl. No.: 16/592,169

(22) Filed: Oct. 3, 2019

(65) Prior Publication Data

US 2021/0102985 A1   Apr. 8, 2021

(51) Int. Cl.
*G01R 1/12* (2006.01)
*G01R 31/64* (2020.01)
*H03B 5/12* (2006.01)
*H02J 3/18* (2006.01)
*H02H 7/16* (2006.01)

(52) U.S. Cl.
CPC ............... *G01R 31/64* (2020.01); *H02H 7/16* (2013.01); *H02J 3/1828* (2013.01); *H03B 5/1265* (2013.01)

(58) Field of Classification Search
CPC ...... G01R 31/42; G01R 31/64; G01R 31/371; G01R 19/16547; H02J 3/1828; H02J 2207/50; H03B 5/1265; H02H 7/16
See application file for complete search history.

(56) References Cited

U.S. PATENT DOCUMENTS

| | | | |
|---|---|---|---|
| 3,968,432 A | 7/1976 | Kelley | |
| 6,753,792 B2* | 6/2004 | Beckwith | H02J 3/1821 340/870.07 |
| 7,667,353 B2* | 2/2010 | Coolidge | G01R 31/64 307/127 |
| 2008/0106241 A1 | 5/2008 | Deaver | |
| 2008/0291593 A1* | 11/2008 | Day | H02H 7/06 361/78 |
| 2013/0204554 A1* | 8/2013 | Tuckey | G01R 31/64 702/58 |
| 2015/0311697 A1* | 10/2015 | Faxvog | H02H 7/04 361/35 |
| 2021/0088555 A1 | 3/2021 | Hao | |
| 2021/0109141 A1* | 4/2021 | Hao | H02J 13/00002 |

* cited by examiner

*Primary Examiner* — Thang X Le
(74) *Attorney, Agent, or Firm* — Bradley W. Schield; Richard M. Edge

(57) ABSTRACT

The present disclosure relates to a wireless neutral current sensor (WNCS) for monitoring a neutral cable of a capacitor bank. The WNCS may include a power storage device that provides power to allow the WNCS to send a test signal to a capacitor bank controller (CBC) of the capacitor bank to confirm operation of the WNCS during commissioning. The WNCS may include processing and communication circuitry that, during operation, detects an electrical characteristic on the neutral cable. The processing and communication circuitry may provide a message indicating the electrical characteristic to the CBC.

17 Claims, 3 Drawing Sheets

WIRELESS NEUTRAL CURRENT SENSOR (WNCS)

TECHNICAL FIELD

The present disclosure relates generally to capacitor bank control and, more particularly, to a wireless neutral current sensor that measures the neutral current of a capacitor bank.

BRIEF DESCRIPTION OF THE DRAWINGS

Non-limiting and non-exhaustive embodiments of the disclosure are described herein, including various embodiments of the disclosure with reference to the figures listed below.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Electric power delivery systems include equipment, such as generators, power lines, transformers, and the like, to provide electrical energy from a source to one or more loads. Various intelligent electronic devices (IEDs) may be used in monitoring and control of the power delivery system. For example, capacitor bank controllers (CBCs) may control capacitor banks in the power delivery system to control delivery of reactive power. To perform control operations, the CBC may receive voltage measurements and current measurements of a power line. Depending on the voltage and current on the power line, the CBC may send signal(s) to connect or disconnect the capacitor bank to provide for power factor correction, kilovolt-ampere reactive (kVAR) support, or voltage improvement.

In multi-phase power systems, the capacitors of the capacitor bank may be connected to each individual phase to improve power quality on each phase delivered on the power system. Each of the phases may be connected to a neutral cable, which may then be grounded. Under normal operating conditions, the neutral current of the fundamental frequency (e.g., 50/60 Hz) in the neutral cable is either zero or very small. A wired current sensor may be connected to the neutral cable to measure and detect an unbalanced neutral current going through the neutral cable, which may indicate an anomaly, such as a capacitor bank failure or a switch failure. However, installing a wired current sensor may involve routing the cable from the wired current sensor to the CBC, which may be difficult and time consuming.

As explained below, a wireless neutral current sensor (WNCS) may be used on the neutral cable to detect anomalies in the capacitor bank system. The WNCS may include a power storage device, such as a replaceable battery, to communicate test signals with the CBC to ensure that the WNCS is working properly during installation. Further, the power storage device may include a rechargeable battery that is charged during anomalies to communicate current measurements to the CBC.

Figure 1:
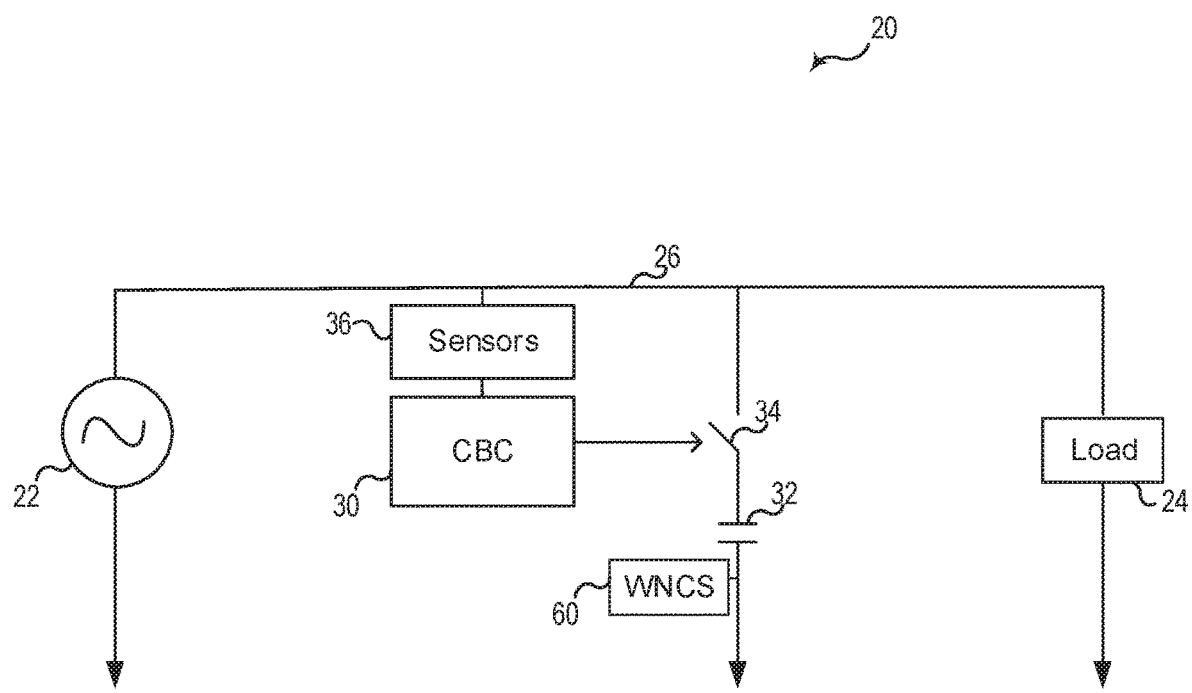
FIG. 1 is a circuit diagram of a power system that has capacitor bank controller (CBC) that controls a capacitor bank of the power system, in accordance with an embodiment.

FIG. 1 illustrates a circuit diagram of an embodiment of an electric power delivery system 20, which may have various electric transmission lines, electric distribution lines, current transformers, buses, switches, circuit breakers, reclosers, transformers, autotransformers, tap changers, voltage regulators, capacitor banks, generators, motors, pumps, compressors, valves, and a variety of other types of monitored equipment. For illustrative purposes, the electric power delivery system 20 includes a power source 22 and a load 24. The electric power delivery system 20 includes a power line 26 that is communicatively coupled between the power source 22 and the load 24 to deliver power from the power source 22 to the load 24.

The CBC 30 may be communicatively coupled to one or more sensors 36 For example, line post current sensors, wireless current sensors, or a combination of line post sensors that measure both voltages and current may be used. Each phase may have different types of sensors, for example, phase A may use a line-post sensor while phase B and C may use wireless current sensors. The three phases may have any different combination of sensors. The voltage sensors may include CPTs or PTs or voltage line post sensors. The electric power delivery system 20 may be monitored by the CBC 30 via the current measurements and voltage measurements from the sensors 36, and the CBC 30 may control a capacitor bank 32 by sending signals to a switching device 34 to electrically connect or disconnect the capacitor bank 32 from the power line 26. While illustrated as a single capacitor, note that several capacitors may be used and the particular size of the capacitor bank may depend on the application.

The CBC 30 may obtain electric power system information using the one or more sensors 36. For example, wired line post sensors may be mounted on a power line or other structure of the power line post to monitor the current and/or voltage of the power line 26. Line post sensors may include current transformers (CTs) that provide a signal indicating current on the power line 26 and/or potential transformers that provide a signal indicating voltage on the power line 26. Similarly, wireless current sensors may provide signals indicating current measurements of the power line. Although illustrated in single-line form for purposes of simplicity, the electric power delivery system 20 may be a multi-phase system, such as a three-phase electric power delivery system.

In multi-phase systems, each phase of the capacitor bank may be electrically connected together and grounded using a neutral cable. A neutral current sensor may be connected to the neutral cable to monitor current through the neutral cable. As mentioned above, routing wires from the wired current sensor to the CBC may be difficult and time consuming. As explained below, a wireless neutral current sensor (WNCS) 60 may be installed on the neutral cable to monitor current through a neutral of the capacitor bank 32 without routing any power and/or communication cables between the WNCS 60 and the CBC 30.

Figure 2:
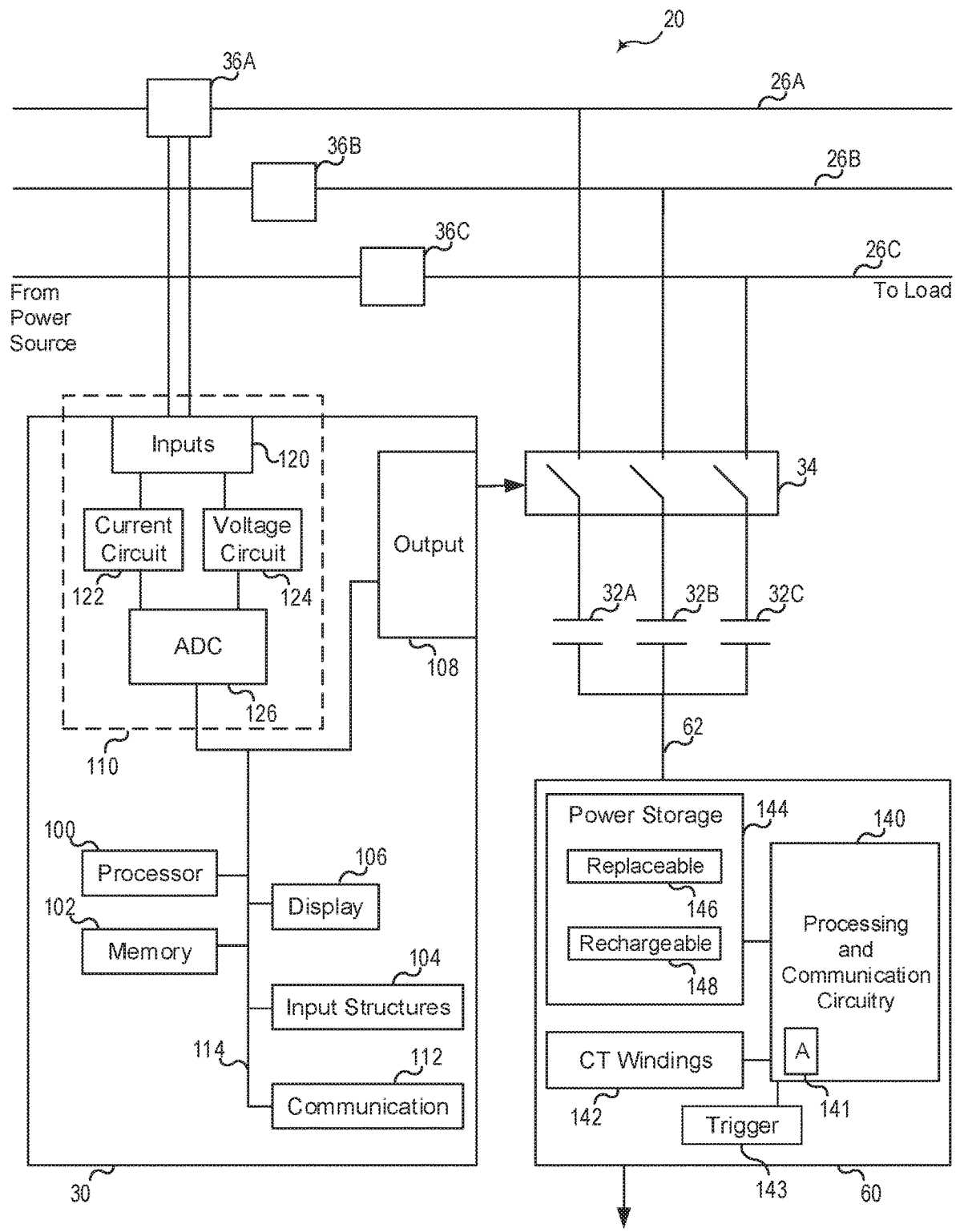
FIG. 2 is a block diagram of the CBC of FIG. 1 that uses a wireless neutral current sensor (WNCS) to detect abnormal conditions of a neutral cable of the capacitor bank, in accordance with an embodiment.

FIG. 2 is a block diagram of a three-phase power delivery system 20 that has a capacitor bank 32A-C that is connected or disconnected based on the voltages and currents on the power line to improve power quality of the power delivered. For example, the capacitor bank 32A-C may connect to or disconnect from each phase individually, or as illustrated, may connect to or disconnect from the three phases together via operation of a ganged switching device 34. The WNCS 60 is installed on a neutral cable 62 to detect current on the neutral cable 62. Each phase of the capacitor bank 32A-32C may be connected to the neutral cable 62, which may then be connected to ground.

In the illustrated embodiment, the CBC 30 includes a processor 100, a computer-readable storage medium 102, input structures 104, a display 106, output circuitry 108, sensor circuitry 110, and communication circuitry 112. The CBC 30 may include one or more bus(es) 114 connecting the processor 100 or processing unit(s) to the computer-readable storage medium 102, the input structures 104, the display 106, the output circuitry 108, sensor circuitry 110, and/or the communication circuitry 112. The computer-readable storage medium 102 may be embodied as memory, such as random access memory (RAM), read only memory (ROM), or a combination thereof, and may include or interface with software, hardware, or firmware modules for implementing various portions of the systems and methods described herein. The computer-readable storage medium 102 may be the repository of one or more modules and/or executable instructions configured to implement any of the processes described herein.

The processor 100 may process inputs received via the sensor circuitry 110 and the communication circuitry 112. The processor 100 may operate using any number of processing rates and architectures. The processor 100 may be configured to perform various algorithms and calculations described herein using computer executable instructions stored on computer-readable storage medium 102. The processor 100 may be embodied as a microprocessor. In certain embodiments, the processor 100 and/or the computer-readable storage medium 102 may be embodied as discrete electrical components, a general purpose integrated circuit, one or more Application Specific Integrated Circuits ("ASICs"), a Field Programmable Gate Array ("FPGA"), and/or other programmable logic devices. The processor 100 and/or the computer-readable storage medium 102 may be referred to generally as processing circuitry.

As illustrated, the sensor circuitry 110 may include, for example, input pins 120 or connectors that receive current signals(s) and voltage signal(s) from the current sensor and the voltage sensor 36A. The sensor circuitry 110 may transform the current and voltage signals using an internal current circuit 122 and an internal voltage circuit 124 to a level that may be measured (e.g., via internal transformers), and sample the signals using, for example, A/D converter(s) 126 to produce digital signals representative of measured voltage and measured current on the power line 26. The A/D converter 126 may be connected to the processor 100 by way of the bus 114, through which digitized representations of voltage signals may be transmitted to the processor 100.

The communication circuitry 112 may include a transceiver and/or communication ports, such as ethernet and serial ports. In some embodiments, the CBC 30 may remotely control switches of the capacitor banks by communicating using the ethernet or serial ports. The communication circuitry 112 may include a wireless transceiver that communicates with a wireless transceiver of the WNCS 60 to send and/or receive wireless current messages, status messages, and/or test messages, among others. The CBC 30 may include a display screen 106 that displays information to notify an operator of operating parameters of the electric power delivery system 20, such as current measurements, voltage measurements, capacitor bank status, power flow direction, etc. The input structures 104 may include buttons, controls, universal serial bus (USB) ports, or the like, to allow a user to provide input settings to the CBC 30. In some embodiments, the display 106 may be a touchscreen display.

The output circuitry 108 may include one or more output pins or connectors that electrically connect the CBC 30 to the switching device 34 to allow the processor 100 to send control signals to the switching device 34 to control connection or disconnection of the capacitor bank 32 to the power line 26.

The CBC 30 may be communicatively coupled to the switching device(s) 34 to send signal(s) to the switching device(s) 34 to electrically connect the capacitor bank 32 to or disconnect the capacitor bank 32 from the power line 26. While the switching device is illustrated as a ganged switching device, in other embodiments, the CBC 30 may be connect to individual switching devices on each phase of the capacitor bank 32. The switching device 34 may be any suitable switching device or combination of devices that connect or disconnect the capacitor bank 32, such as metal-oxide-semiconductor field-effect transistors (MOSFETs), relays, switches, etc.

In the illustrated embodiment, the WNCS 60 includes processing and communication circuitry 140. In some embodiments, the processing and communication circuitry 140 may have similar hardware as described with respect to the CBC 30. For example, the processing and communication circuitry 140 may include a processor, such as a microprocessor, and memory. The processor may execute instructions on the memory to perform the operations described in conjunction with FIG. 3. Further, the processing and communication circuitry 140 may include a transceiver that sends signals to and receive signals from the CBC 30.

The WNCS 60 may include CT windings 142 that may be enclosed around the neutral cable 62 to allow the WNCS 60 to obtain current measurements of the neutral cable 62. The processing and communication circuitry 140 may execute instructions that cause the WNCS 60 to obtain various current characteristics of the neutral cable 62 from the current measurements obtained via the CT windings 142, such as fundamental frequency measurements, harmonic measurements, magnitude measurements, phase measurements, etc.

The WNCS 60 may include a power storage device 140 having a replaceable battery 146 and a rechargeable battery 148, or a hybrid-layer capacitor (HLC). The replaceable battery 146 may be used during installation of the WNCS 60. For example, an operator may cause the WNCS 60 to use power from the replaceable battery 146 to send a test signal to the CBC 30 to notify the operator that the WNCS 60 is working properly during installation.

Additionally, because the neutral current may be zero or very small in normal operations, the amount of current may not allow the WNCS 60 to operate using the power harvested from the current on the neutral cable 62. Therefore, the WNCS 60 may use the replaceable battery 146 to periodically send a status signal, such as an "alive" or "keep alive" signal, indicating the state of the WNCS 60 to allow the CBC 30 to ensure that the WNCS 60 is functioning properly. The operator may set the frequency of the keep alive signals at the CBC 30 or at the WNCS 60 (e.g., each 5 seconds, 15 seconds, 30 seconds, 1 minute, 10 minutes, 1 hour, etc.) depending on the particular implementation.

The rechargeable battery 148 may provide power to allow the WNCS 60 to provide current messages of current characteristics to the CBC 30 from the current measurements of the neutral cable 62, such as zero crossings of the current, a fundamental frequency current magnitude message, a third harmonic current magnitude and phase shift message, an unbalanced neutral current warning message, an unbalanced neutral current trip message, a high harmonic content in the neutral current message, or the like. The processing and communication circuitry 140 may use the power from the rechargeable battery 148 to process the current measurements (e.g., obtain third harmonic current magnitudes) and to output the current messages to the CBC 30. The processing and communication circuitry 140 may operate without any electrical conductors connected to the CBC that provide power by operating with electrical energy obtained from current through the neutral cable and the power storage device, or a combination of both. The WNCS 60 may have thresholds set and stored in the memory of the processing and communication circuitry 140 to determine the contents of warning, trip, and high harmonic messages. The WNCS 60 may compare the thresholds to the values obtained from the current measurements, and upon exceeding a particular threshold, sending the current message to the CBC 30 to allow the CBC 30 to perform control actions based on the current messages.

Figure 3:
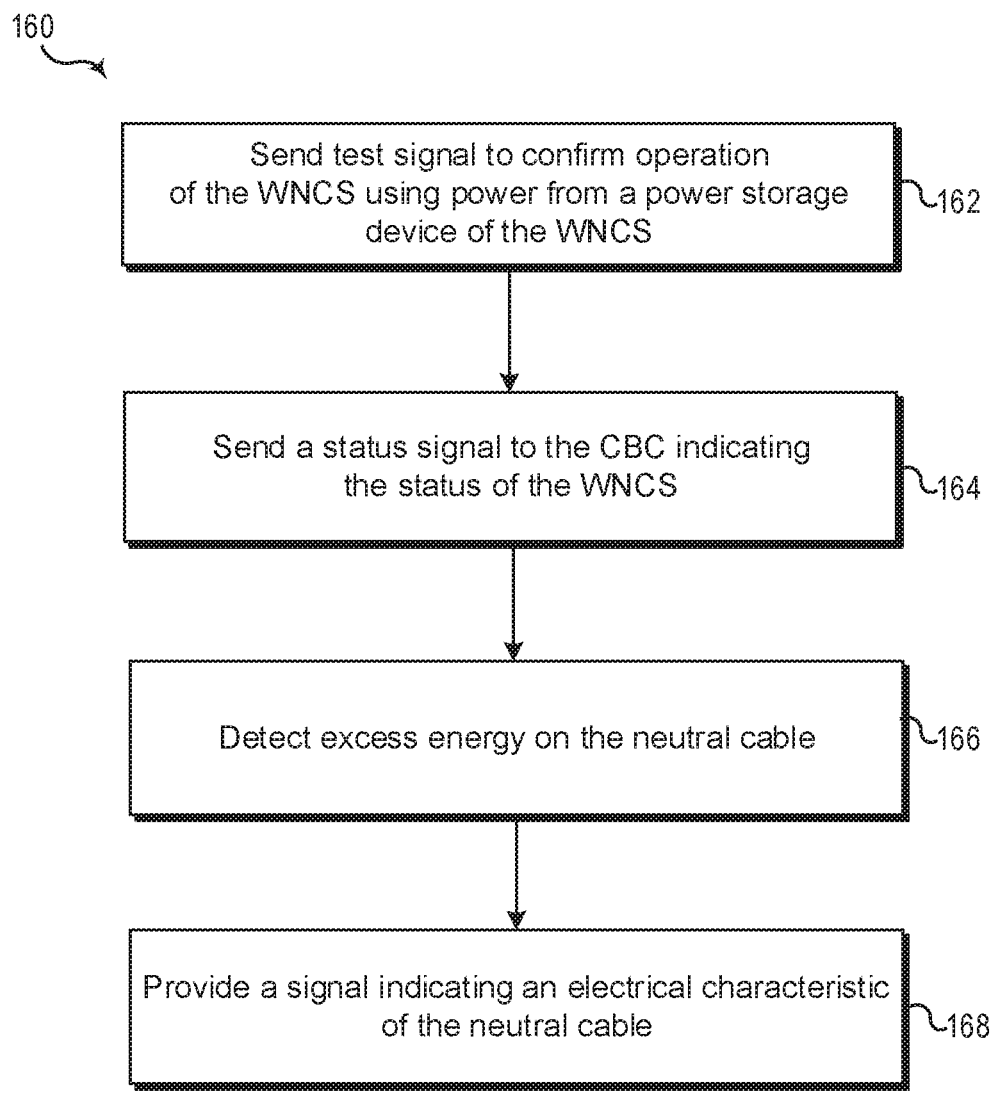
FIG. 3 is a flow diagram of a process performed by the WNCS of FIG. 2 in conjunction with the CBC, in accordance with an embodiment.

FIG. 3 is a flowchart of a process 160 that may be performed by the WNCS 60 in conjunction with the CBC 30 to control operation of the capacitor bank 32. The WNCS 60 may be installed on the neutral current cable 62 in any suitable orientation. The WNCS 60 may be mounted (e.g., onto a wooden pole of the neutral cable 62) using a mounting bracket. The processing and communication circuitry 140 may include an internal or external antenna 141. An external antenna 141 may be adjustable to allow an operator to change the orientation of the WNCS while transmitting signal patterns that are suitable to the application.

The WNCS 60 may send, using power from the replaceable battery, test signals to the CBC 30 to confirm operation of the WNCS 60 (block 162). In some embodiments, the WNCS 60 may send the test signal upon detecting a magnetic field greater than a threshold. For example, the processing and communication circuitry 140 may detect an operator using a triggering device 143, such as a magnet tool that causes currents in the CT windings 142, a push button, a switch, or the like, which may trigger the WNCS 60 to send the test signal. In other embodiments, the operator may use the CBC 30 (e.g., via a prompt on the CBC 30) to send a request to the WNCS 60 to respond with the test signal. The CBC 30 may receive the test signal and provide a notification to the operator, via the display 106, to indicate that the WNCS 60 is operating properly.

Upon confirming that the WNCS 60 has been installed and is operating properly, the WNCS 60 may periodically send a status signal indicating the status of the WNCS 60 (block 164). For instance, the WNCS 60 may send an "alive" signal indicating that the WNCS 60 is still operating properly. In some embodiments, the status signal may indicate, for example, the charge of replaceable battery. The CBC 30 may wait to receive the status signal from the WNCS 60. For example, the CBC 30 may have a timer that resets upon receiving each status signal. If the timer expires due to the CBC 30 not receiving the status signal within a time period, the CBC 30 may provide a message indicating that communication has been lost between the CBC 30 and the WNCS 60. An operator may replace the replaceable battery after a period of time (e.g., 2 years, 5 years, 10 years, 20 years etc.) to allow the WNCS 60 to continue to send the periodic status signals.

The WNCS 60 may detect, using power from the rechargeable battery, current characteristics on the neutral cable 62 that exceed a threshold under abnormal conditions (block 166). For example, current imbalances between the phases may cause an increase in third harmonics which may be detected.

The WNCS 60 may then provide a current message to the CBC 30 indicating the current characteristic (e.g., abnormal/anomalous current conditions) of the neutral cable (block 166). For example, if unbalanced currents in each of the phases cause the fundamental frequency current magnitude in the neutral cable 62 to exceed a first threshold, the WNCS 60 may provide a warning message using the power from the rechargeable battery. Further, if the current magnitude exceeds a second threshold, the WNCS 60 may provide a trip message signaling for the CBC 30 to open the switching device 34 to disconnect the capacitor bank 32.

By installing WNCSs on the neutral cable of capacitor banks, abnormal conditions in the capacitor bank may be detected without routing wired cables between the neutral sensor and the CBC. Further, by using a power storage device on the WNCS, the WNCS may provide status signals to the CBC as well as use power harvested from the CT windings to provide messages to the CBC based on the current measurements of the neutral cable. The WNCS may provide warnings or trip messages to the CBC to ensure that the CBC may make accurate control decisions that improve power system quality.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A wireless neutral current sensor (WNCS), comprising:
   a power storage device configured to provide power to allow the WNCS to operate during commissioning; and
   processing and communication circuitry configured to:
      during commissioning, send a test signal to a capacitor bank controller (CBC) of a capacitor bank to confirm operation of the WNCS;
      during operation, obtain a current characteristic of a neutral cable of the capacitor bank; and
      transmit a wireless current message indicating the current characteristic to the CBC.

2. The WNCS of claim 1, wherein the processing and communication circuitry is configured to receive power using a combination of power from the neutral cable and the power storage device to allow the WNCS to operate without any electrical conductors connected to the CBC that provide power.

3. The WNCS of claim 1, wherein the power storage device comprises:
a replaceable battery configured to power the WNCS to send the test signal to confirm operation of the WNCS during commissioning;
current transformer (CT) windings configured to allow the WNCS to be powered using energy from the neutral cable; and
a rechargeable battery configured to:
receive energy harvested from the neutral cable from the power harvesting circuitry when current flows through the neutral cable; and
power the WNCS using the received energy to send the current message.

4. The WNCS of claim 3, wherein the processing and communication circuitry is configured to, upon receiving a magnetic trigger from a triggering device, send the test signal to the CBC.

5. The WNCS of claim 2, wherein the replaceable battery is configured to, during operation, provide power to allow the processing and communication circuitry to periodically send a status signal indicating a status of the WNCS.

6. The WNCS of claim 5, wherein the processing and communication circuitry is configured to receive a frequency signal indicating a frequency at which to periodically communicate the status signal.

7. The WNCS of claim 1, comprising a clamping mechanism configured to attach the WNCS to the neutral cable.

8. The WNCS of claim 1, comprising an internal antenna.

9. The WNCS of claim 1, comprising an external antenna that allows for changing orientation of the WNCS by adjusting the external antenna.

10. A capacitor bank controller (CBC), comprising:
a wireless neutral current sensor (WNCS) comprising a power storage device configured to provide power to the WNCS to allow the WNCS to send a wireless current message to the CBC indicating a current characteristic of a neutral cable of a capacitor bank;
memory; and
a processor operatively coupled to the memory, wherein the processor is configured to:
obtain the current message from the WNCS; and
perform a control action based on the current characteristic of the neutral cable;
wherein the power storage device comprises:
a replaceable battery configured to power the WNCS to send a test signal to the CBC to confirm operation of the WNCS during commissioning; and
a rechargeable battery configured to:
receive energy harvested from the neutral cable when current flows through the neutral cable; and
power the WNCS using the received energy to send the current message.

11. The CBC of claim 10, wherein the WNCS is configured to send the test signal upon detecting a magnet trigger signal from a triggering device.

12. The CBC of claim 10, wherein the WNCS comprises processing and communication circuitry configured to provide a warning message based upon the current characteristic exceeding a first threshold current characteristic.

13. The CBC of claim 12, wherein the processing and communication circuitry is configured to send a trip message indicating that the current characteristic exceeded a second threshold current characteristic.

14. The CBC of claim 10, wherein the WNCS is configured to send the current message comprising a fundamental frequency current magnitude, a third harmonic current magnitude, a third harmonic current phase shift, high harmonic content, or any combination thereof.

15. A wireless neutral current sensor (WNCS), comprising:
a power storage device comprising:
a replaceable battery configured to power the WNCS to send a test signal to a capacitor bank controller (CBC) to confirm operation of the WNCS during commissioning;
a rechargeable battery configured to:
receive energy harvested from a neutral cable of a capacitor bank from the power harvesting circuitry when current flows through the neutral cable; and
power the WNCS using the received energy; and
processing and communication circuitry configured to:
during operation, obtain a current characteristic of the neutral cable; and
transmit a wireless current message indicating the current characteristic to the CBC.

16. The WNCS of claim 15, wherein the processing and communication circuitry is configured to, upon receiving a magnetic trigger from a triggering device, send the test signal to the CBC.

17. The WNCS of claim 15, further comprising current transformer (CT) windings configured to allow the WNCS to be powered using energy from the neutral cable.

* * * * *